United States Patent [19]

Oh et al.

[11] Patent Number: 5,661,077

[45] Date of Patent: Aug. 26, 1997

[54] METHOD FOR FABRICATING AN OPTICAL INTEGRATED CIRCUIT

[75] Inventors: Kwang-Ryong Oh; Ju-Heon Ahn; Jeong-Soo Kim, all of Daejeon, Rep. of Korea

[73] Assignees: Electronics And Telecommunications Research Institute, Daejeon; Korea Telecommunication Authority, Seoul, both of Rep. of Korea

[21] Appl. No.: 360,135

[22] Filed: Dec. 20, 1994

[30] Foreign Application Priority Data

Nov. 30, 1994 [KR] Rep. of Korea ............... 94-32105

[51] Int. Cl.⁶ .................................................. H01L 21/20

[52] U.S. Cl. ............................................. 438/31; 438/41

[58] Field of Search ........................ 437/129, 93, 133

[56] References Cited

U.S. PATENT DOCUMENTS

| | | | |
|---|---|---|---|
| 5,084,894 | 1/1992 | Yamamoto | 372/50 |
| 5,400,356 | 3/1995 | Bringams et al. | 372/46 |

FOREIGN PATENT DOCUMENTS 0021386  2/1986  Japan .......................... 437/93

OTHER PUBLICATIONS

Wolf et al. in "Optical Communications", vo. 3(5), Sep./Oct (1992), pp. 517–521.

*Primary Examiner*—Charles L. Bowers, Jr.
*Assistant Examiner*—Ramamohan Rao Paladugu
*Attorney, Agent, or Firm*—Larson And Taylor

[57] ABSTRACT

Disclosed is a method for fabricating an optical integrated circuit capable of obtaining a current confinement and a maximum opto-coupling efficiency by using a simple process, in a case where an active device such as an optical waveguide and an optical amplifier. The method comprises a step for growing layers constituting the optical device over an InP substrate, a step for etching the grown layers by use of a wet etching method or a dry etching method of RIE along a plane perpendicular to a (001) plane, and a step for growing a core layer and a clad layer of the waveguide to be optically connected by use of a molecular organic chemical vapor deposition.

3 Claims, 9 Drawing Sheets

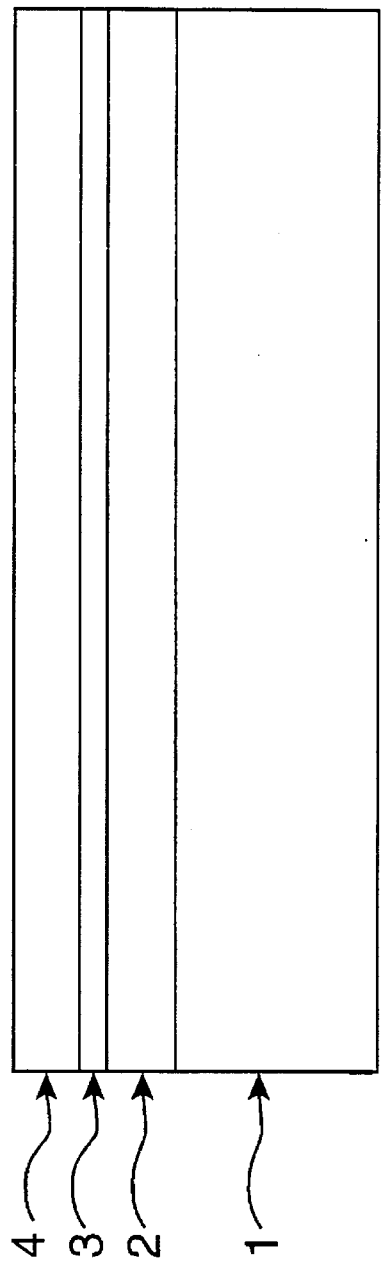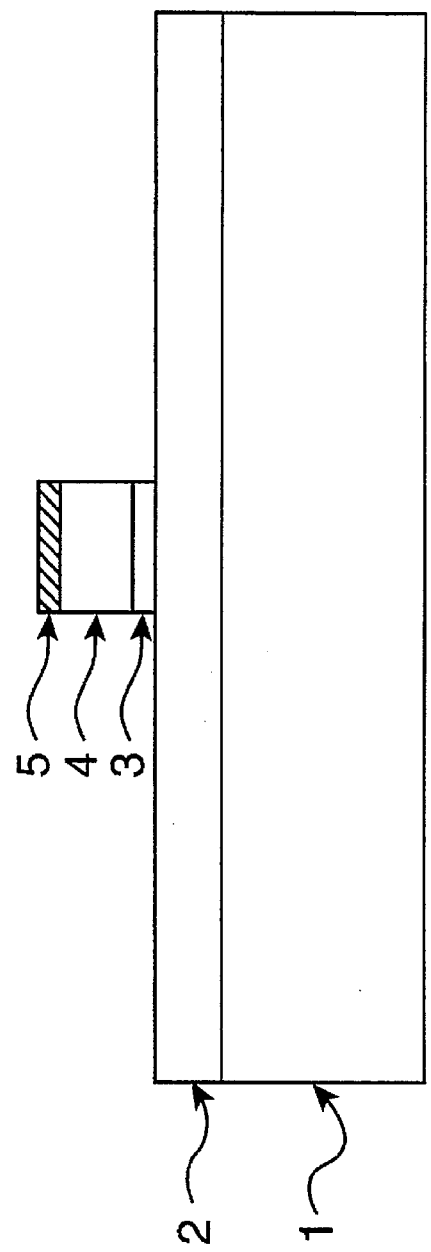

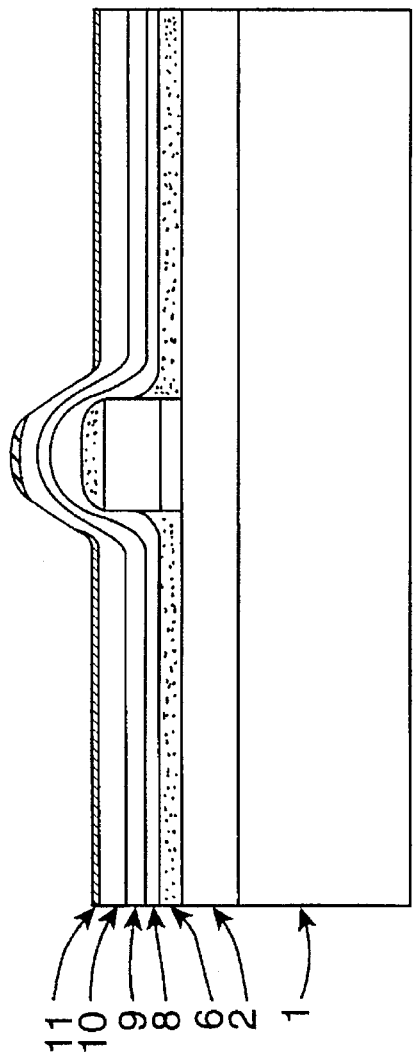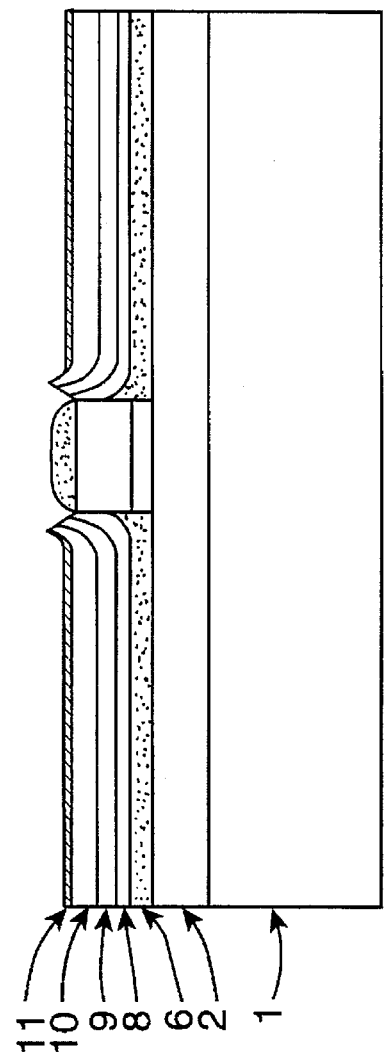

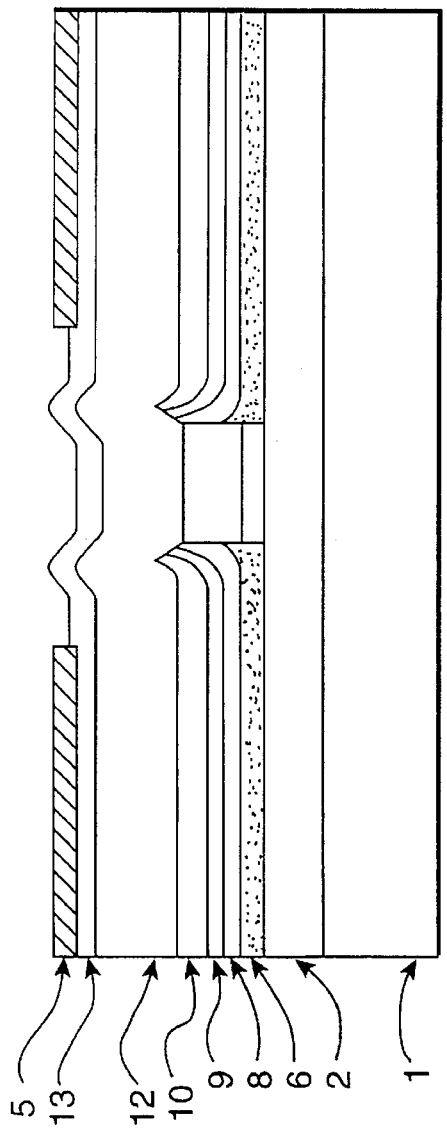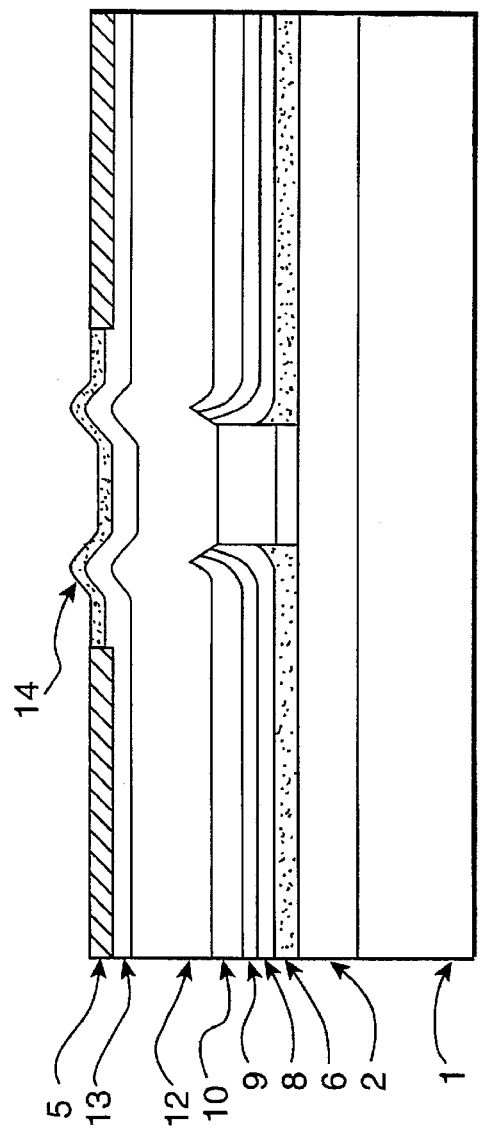

METHOD FOR FABRICATING AN OPTICAL INTEGRATED CIRCUIT

BACKGROUND OF THE INVENTION

The present invention relates to a method for fabricating an optical integrated circuit which is constituted by optical devices and an optical waveguide within one chip. In more particular, it relates to a method for fabricating an optical integrated circuit capable of obtaining a current confinement and an opto-coupling efficiency of maximum by using a simple process, in case where an active device such as an optical waveguide and an optical amplifier, or the like.

In a case where a laser diode, an optical detector, and an optical filter, etc., have been integrated within one chip, an optical waveguide has been used as a medium for connecting between them. At this point, the satisfaction of the specifications of the respective devices and the maximization of the opto-coupling efficiency between optical devices and a waveguide are taken into consideration.

When several devices are integrated within one chip, the crystal growth process should be carried out several times, because the specifications required for the different devices are different.

FIGS. 1A, 1B and 1C show methods for fabricating several optical devices within one chip, which are the most frequently used in the prior art. Referring to FIG. 1A, a buffer layer 2, an active layer 3 and a clad layer 4 constituting an optical amplifier is grown over a substrate 1 by use of a primary epitaxy-grown process. A dielectric layer 5 such as $SiN_x$ or $SiO_2$ is deposited over the clad layer 4 and then is subjected to a photo-etching process to expose the clad layer at which a core layer is formed. The exposed clad layer 4 and the active layer 3 underlying the clad layer 4 is sequentially wet-etched using the dielectric layer 5 as a mask. The core layer 6 constituting an optical waveguide is selectively formed over the portion where the dielectric layer 5 is has been etched.

When growing the core layer 6, the ingredients of the growth layer provided over the dielectric layer 5 are not grown thereover, but are provided from outside the dielectric layer 5 due to a diffusion.

Because the diffusion is not a non-planar growth, a uniform growth layer can be obtained over the whole surface. However, in the case of a selective growth using a dielectric layer, the ingredients provided over the dielectric layer are diffused into the definite surface of a semiconductor layer. Because the relative bonding ratio of ingredients such as In, Ga, As and P is different, the growth condition becomes different in accordance with the distance from the dielectric layer. Therefore, a uniform composition over the surface of the semiconductor layer in the neighbor of the dielectric layer can not be obtained, so that an epitaxy layer of good quality can not be obtained. And, the shape of the growth pattern is difficult to form the opto-coupling characteristic.

Another integrated method is shown in FIG. 1B. Referring to FIG. 1B, a buffer layer 2, an active layer 3 and a clad layer 4 constituting an optical amplifier are sequentially grown over a substrate 1, and then are subjected to a photo-etching process to form an optical amplifier pattern. A core layer 6 and a clad layer 7 constituting a waveguide are sequentially grown over the whole surface of the substrate, thereby simultaneously making horizontal opto-coupling and a vertical opto-coupling. Another integrated method can obtain an excellent opto-coupling efficiency, but in the design of an optical amplifier, the thickness and doping of the growth layers are restricted.

FIG. 1C shows still another integrated method. Referring to FIG. 1C, a buffer layer 2, a core layer 6 of a waveguide, a first clad layer 9, an active layer 3 of an optical amplifier and a second clad layer 4 are sequentially grown over a substrate 1 by use of a primary epitaxy growth process and then are subjected to a photo-etching process to etch the active layer 3 except for an optical amplifier pattern. Then a third clad layer 7 constituting a waveguide is grown by use of a secondary epitaxy growth process.

At this time, considering the loss of a waveguide, the third clad layer 7 may be undoped. However, it has compatibility in that the growth layer 7 serving as the clad layer of an optical amplifier should maintain a proper doping level so as to obtain the excellent gain effect due to a p/n junction.

SUMMARY OF THE INVENTION

Accordingly, it is an object of the present invention to solve the compatibility problem of an opto-coupling efficiency and a current confinement when integrating active optical devices such as a waveguide and an optical amplifier. It is also an object to provide a method for fabricating an optical integrated circuit capable of simultaneously maximizing the current confinement and the opto-coupling efficiency with a simple process.

The other objects and features of the present invention can be achieved by providing a method for fabricating a semiconductor optical integrated circuit including an active-optical device and a waveguide, comprising: a primary epitaxy growth process for sequentially growing a buffer layer made of an n-type InP, an active layer made of InGaAsP and a clad layer made of a p-type InP constituting an active-optical device over an InP wafer by use of a primary epitaxy growth; a first etching process for dry-etching the clad layer and the active layer with an RIE method along a <011> plane perpendicular to a (001) plane, thereby forming a rib pattern; a secondary process for sequentially growing a core layer made of InGaAsP and InP clad layers (or current shield layer) of n/p/n structure constituting a waveguide by use of a metal organic chemical vapor (MOCV) deposition method, said layers not being formed at a (111) plane of the rib pattern; a second etching process for selectively etching the InP clad layers of n/p/n structure over the rib pattern; and a third epitaxy growth process for growing a clad layer made of a p-type InP and a cap layer made of a p-type InGaAs constituting an active-optical device.

BRIEF DESCRIPTION OF THE DRAWINGS

FIG.3 is a diagram illustrating configuration of an optical integrated circuit that a waveguide and an optical amplifier are integrated within one chip in accordance with the present invention, wherein

FIGS. 4A to 4L are sectional views illustrating a method for an optical amplifier and a waveguide integrated within one chip in accordance with the present invention, respectively.

DETAILED DESCRIPTION OF THE INVENTION

Figure 1A:
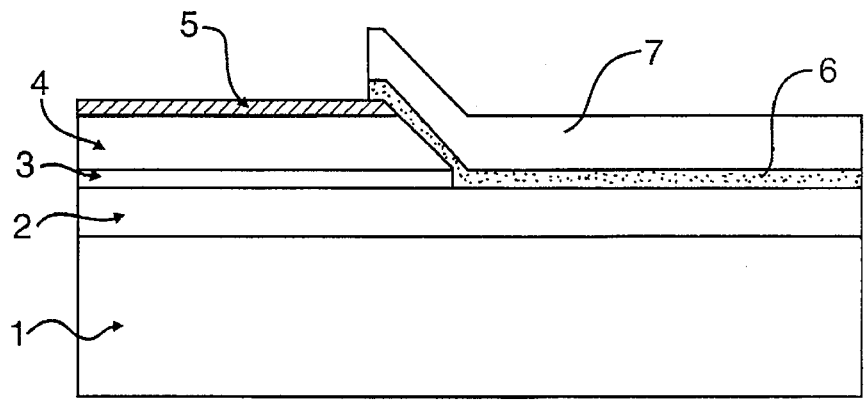
FIGS. 1A through 1C are schematic sectional views of a semiconductor optical amplifier and a waveguide integrated within one chip in the prior art.
Figure 1B:
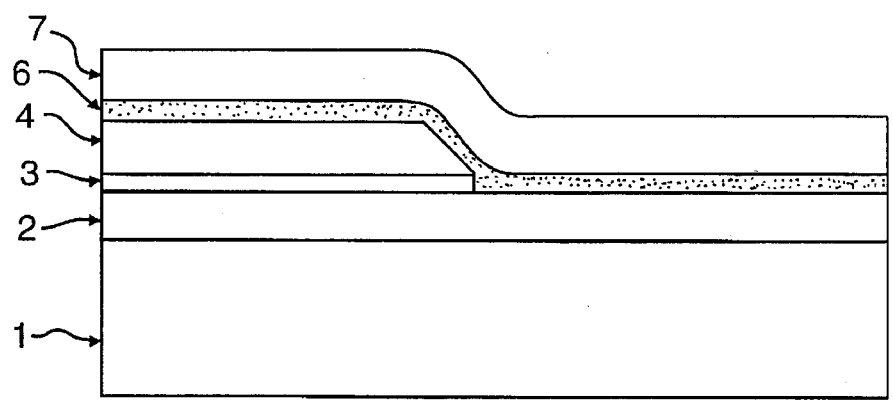
Figure 1C:
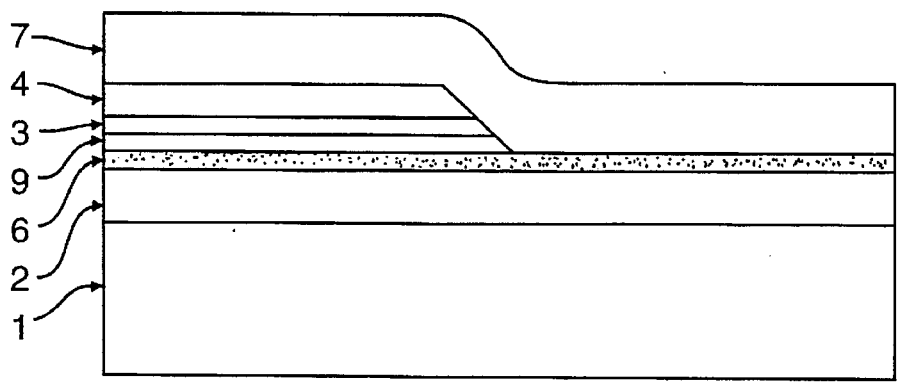
Figure 2A:
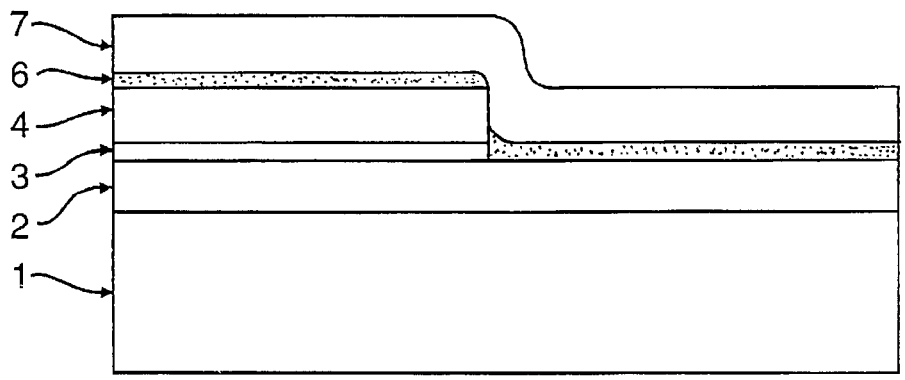
FIGS. 2A through 2C are schematic sectional views of a semiconductor optical amplifier and a waveguide integrated by non-planar crystal growth of a metal organic chemical vapor deposition after a reactive ion etching to be utilized in the present invention.
Figure 2B:
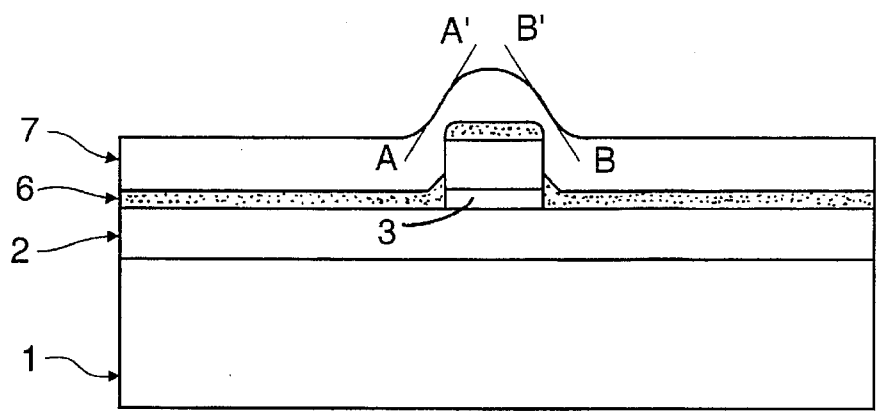

FIGS. 2A and 2B show the main process according to a method for fabricating an optical integrated circuit proposed in the present invention.

First, a method for fabricating an optical integrated circuit of the present invention is to be explained hereinafter with reference to FIG. 2.

FIG. 2A is a sectional view of a <011> plane after a secondary epitaxy growth process. Thus, layers constituting an optical amplifier are grown by a primary epitaxy growth process and in order to optically couple an optical amplifier and a waveguide corresponding to an optical amplifier portion is dry-etched with an RIE etching method using a dielectric material such as $SiN_x$ or $SiO_2$ as a mask and the dielectric layer is removed. Finally a secondary epitaxy growth process is carried out.

At this constant, on growing a core layer, over a (011) plane formed in the vertical direction by a RIE dry etching method, the core layer 6 of a waveguide is nearly not grown, so that the core layer of the planar surface which is capable of obtaining an excellent opto-coupling efficiency, is grown.

FIG. 2B show a sectional view illustrating formation of a buried hetero-structure for raising a current confinement effect of an optical amplifier. FIG. 2B is a sectional view of a <011> plane perpendicular to the sectional direction of FIG. 2A which is a travel direction of light.

At this point, FIG. 2 shows a sectional shape after non-planar growth using a secondary epitaxy growth process, in a case where the width of a stripe pattern of an optical amplifier is smaller than several microns. A (111) plane is created shown as A–A' and B–B' of FIG. 2B, so that a shape like a mountain is formed.

Figure 2C:
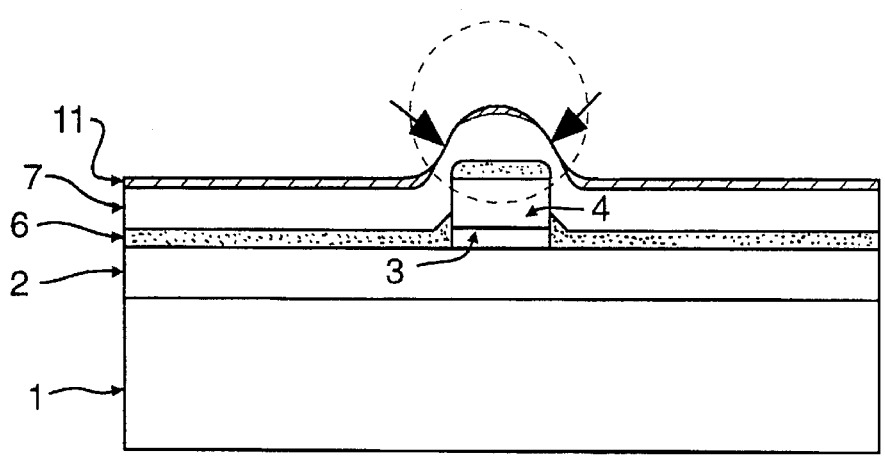

At this point, when an InGaAs layer 11 is further formed, the layer 11 is very slowly grown in the (111) plane as shown in FIG. 2C.

After epitaxy growth of the InGaAs layer 11, the InP clad layer 7 is selectively etched by use of a selective etchant for InP such as $H_3PO_4:HCl$ to remove the dotted portion thereof and the InGaAs layer 11 and the InGaAsP core layer 6 are etched by use of a selective etchant for InGaAsP such as $H_3PO_4:H_2O_2$. A p-type clad layer and a p-type cap layer constituting an optical amplifier are grown by use of a third epitaxy growth process, so that an optical amplifier can be fabricated.

Herein, the stripe direction of an optical amplifier should be in the <011> plane so as to make the selectively etched portion of InP have a groove shape. The process will be explained hereinafter.

Figure 3A:
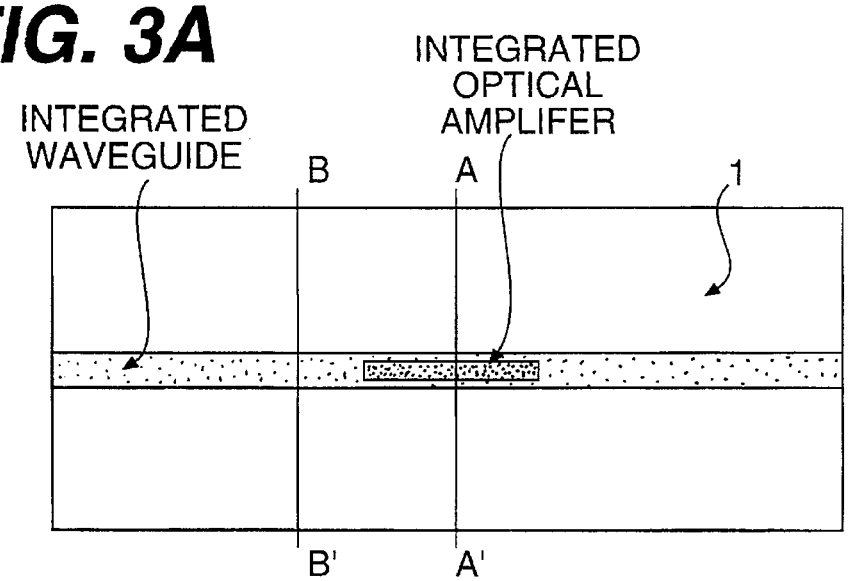
FIG. 3A is a plan view and FIG. 3B is a cross-sectional view taken along a line of A–A'.
Figure 3B:
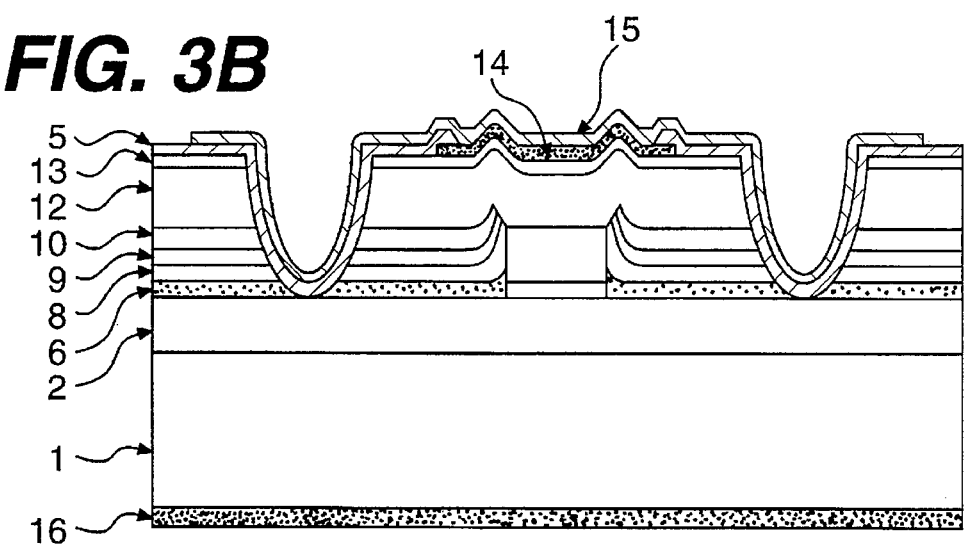
Figure 3C:
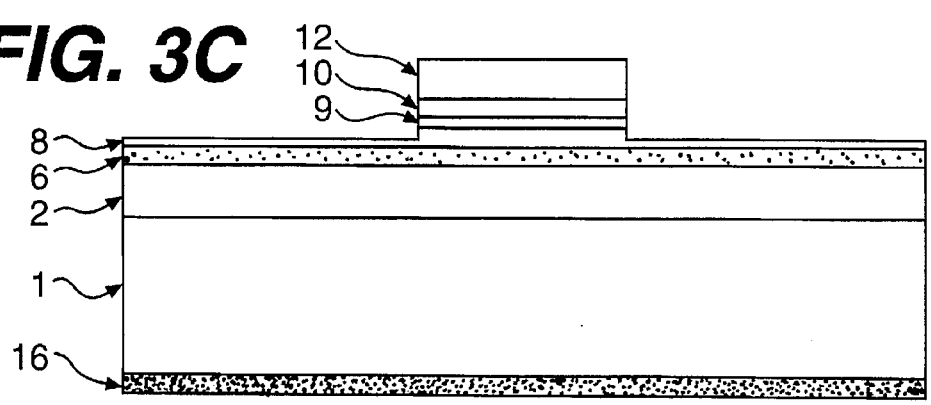

FIG. 3 shows a diagram illustrating an integrated optical circuit fabricated by a method of the present invention, wherein FIG. 3A is a plan view and FIGS. 3B and 3C are sectional views taken along lines of A–A' and B–B' of the optical integrated circuit in FIG. 3A, respectively.

Next, the method for fabricating an optical integrated circuit in accordance with the present inventing will be described in more detail with reference to FIGS. 3A to 3C.

FIGS. 4A to 4L are sectional views perpendicular to a <011> plane, illustrating a method for fabricating an optical integrated circuit in accordance with the present invention.

The sectional view perpendicular to the <011> plane in the opto-coupling creation portion is identical with FIG. 4A and the method will be described with reference to FIG. 2A.

i) An epitaxy layer for a semiconductor optical amplifier is primarily grown by use of an MOCVD or a liquid phase epitaxy (LPE) process. The epitaxy layer consists of a substrate 1 made of an n-type InP, a buffer layer 2 of an n-type InP, an active layer 3 made of InGaAsP and a clad layer 4 made of a p-type InP.

ii) A dielectric layer such as $SiN_x$ or $SiO_2$ is deposited over the clad layer 4 and then is subjected to a photo-etching process to form a dielectric pattern 5 having a narrow width of below 2 to 3 µm as shown in FIG. 4B. The clad layer 4 made of a p-type InP and the active layer 3 made of InGaAsP are dry-etched by use of an RIE method under a condition that the dielectric pattern 5 is used as a mask. Then, the dielectric pattern 5 is removed iii) A rough surface of the exposed substrate is very thinly etched by use of $H_2SO_4$ so as to carry out a secondary epitaxy growth process.

Over the whole surface of the substrat at a core layer 6 constituting a waveguide made of InGaAsP which has a bandgap wider than the active layer 3 of an optical amplifier is grown and then an n-type InP layer 8, a p-type InP layer 9 and an n-type InP layer 10 serving as a clad layer of a waveguide and a current block layer of an optical amplifier are sequentially grown.

Figure 4E:
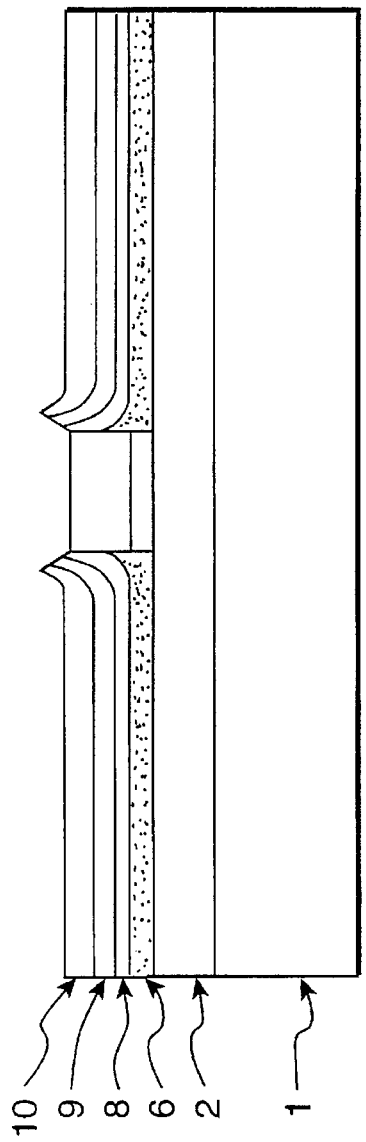
Figure 4F:
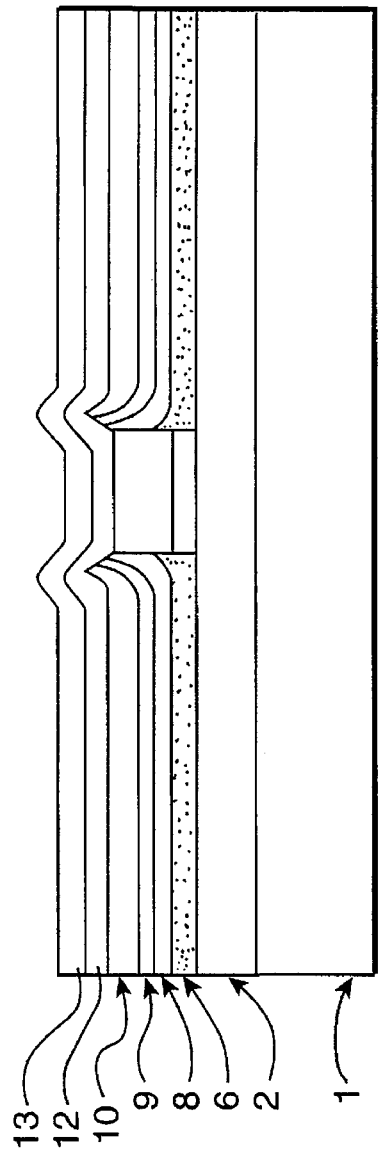
Figure 4I:
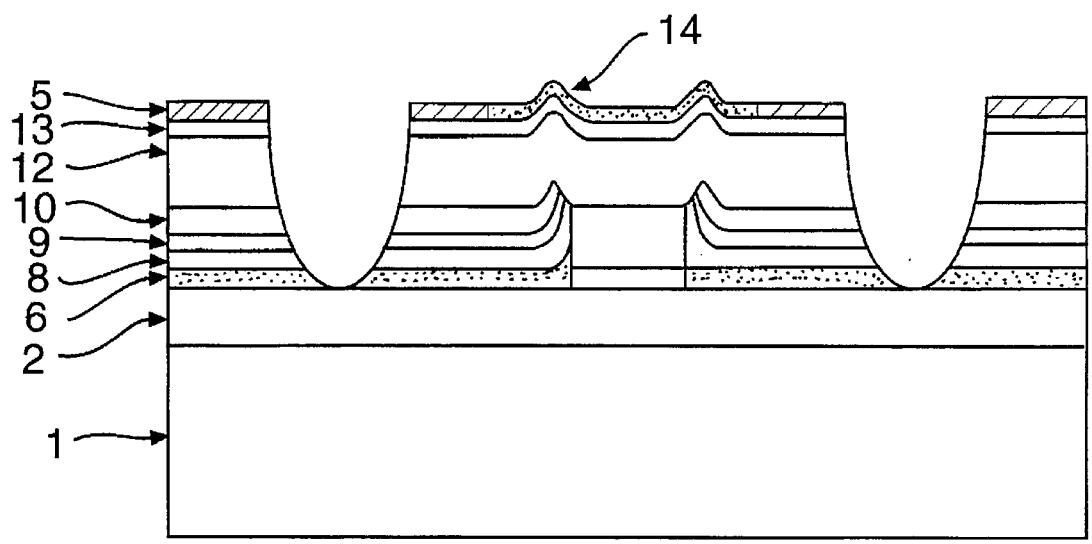
Figure 4J:
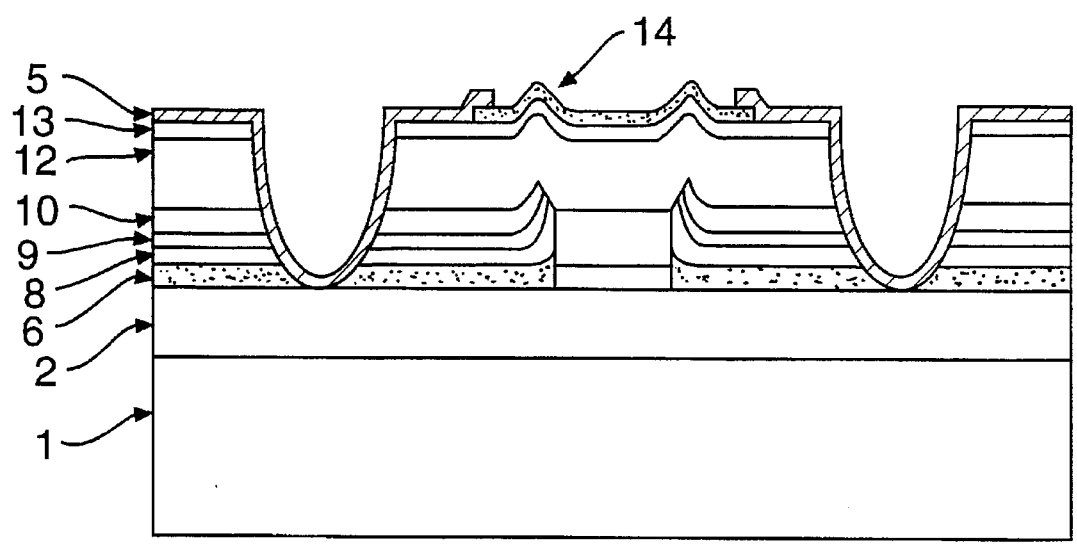
Figure 4K:
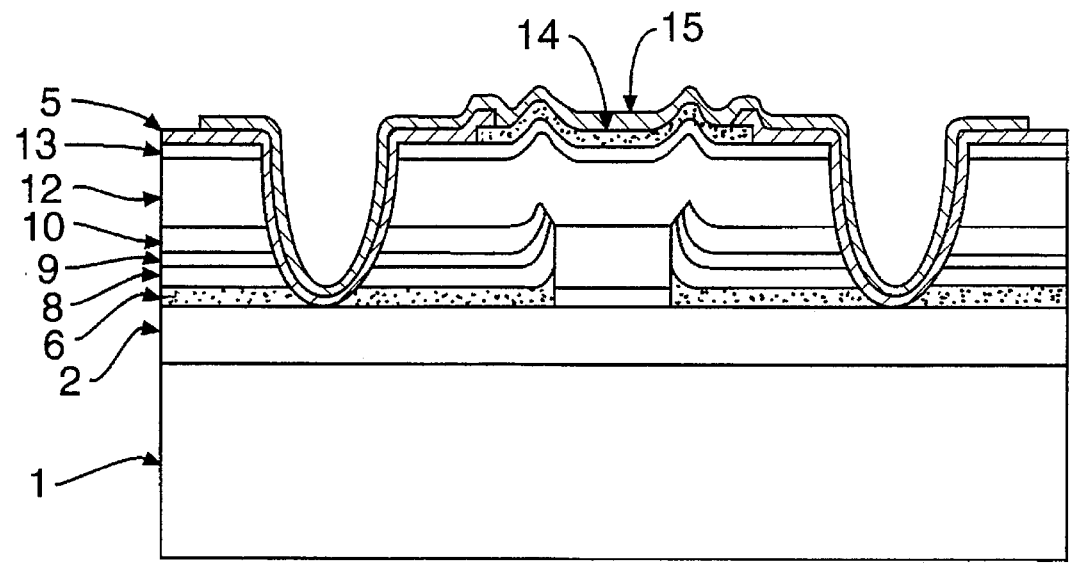
Figure 4L:
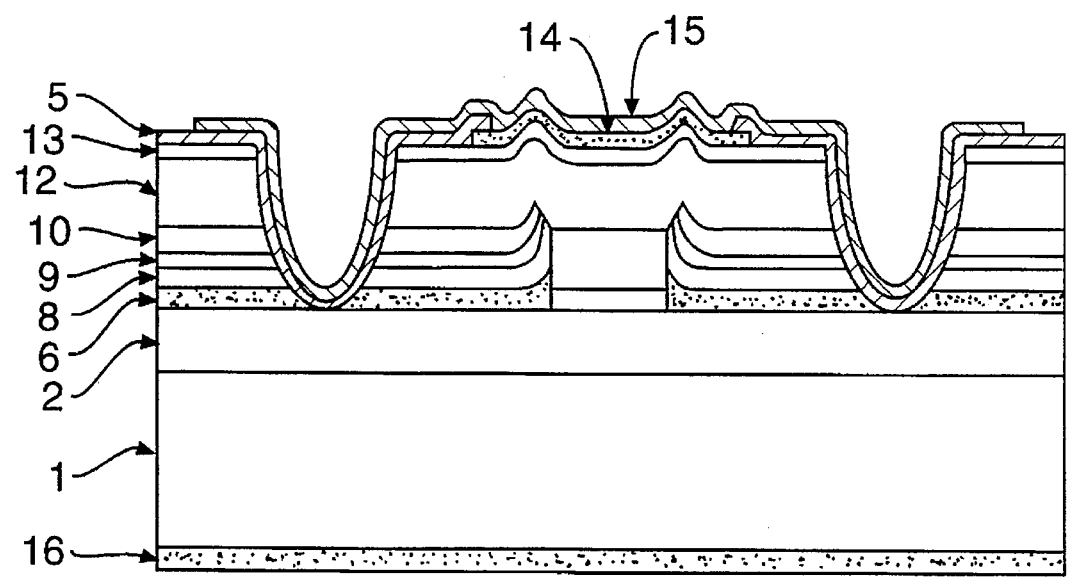

At this constant, a (111) plane is created at the InP layers of said n/p/n structure grown over the active layer 3 of an optical amplifier. An InGaAs layer 11 serving as an etching mask in a lift-off process is grown. At this constant, the InGaAs layer 11 is not grown over the (111) plane and the InP layers of the (111) plane are exposed as shown in FIG. 4C.

iv) After the secondary growth process, the exposed InP layer 11 is etched by use of a selective etchant for InP such as $H_3PO_4:HCl$ and $HCl:H_2O$, or the like. First, the InP layers in the (111) plane that the InGaAs layer 11 is not grown, is etched using the InGaAs layer 11 as a mask for lift off, thereby lifting-off the layers over the InGasP core layer 6 of an optical amplifier portion as shown in FIG. 4D.

v) The remnant InGaAs layer 11 and the InGaAsP layer 6 of an optical amplifier portion are selectively etched by use of a selective etchant for InGaAs and InGaAs and such as $H_3PO_4:H_2O_2$ as shown in FIG. 4E vi) A clad layer 12 made of a p-type InP and a cap layer 13 made of a p-type InGaAs are grown by use of a third epitaxy growth process of an MOCVD or LPE as shown in FIG. 4F.

vii) A $SiN_x$ layer 5 is deposited over the cap layer 13 and then is subjected to a photo-etching process to remove the $SiN_x$ layer 5 at which an electrode is to be formed as shown in FIG. 4G.

viii) A p-type electrode 14 is formed over the portion which the $SiN_x$ layer 5 be removed at through an E-beam deposition process and a lift-off process as shown in FIG. 4H.

ix) In order to make a parasitic capacitance due to formation of a pad to be minimum, the $siN_x$ layer 5 at both sides of an optical amplifier portion is removed and then the layers over the buffer layer 2 are etched using the dielectric layer 5 as a mask, thereby forming a channel as shown in FIG. 4I.

x) The $SiN_x$ layer 5 which is used as a mask on forming a channel and a $SiN_x$ layer 5 is again deposited over the whole surface of the substrate and then is subjected to a photo-etching process to expose the p-type electrode 14 for connection of the p-type electrode with pad as shown in FIG. 4J.

xi) The pad 15 is formed by use of an electrical plating as shown in FIG. 4K.

A SiN$_x$ layer is formed over the pad 15 and then subjected to a photo-etching process to from a SiN$_x$ pattern and then the pad of a waveguide portion which is connected to an optical amplifier portion, is etched by use of an RIE method under a condition that a SiN$_x$ pattern is used as a mask.

xii) The substrate 1 having a thickness of about 350 μm make a lapping to a thickness of about 100 μm and an n-type metal is deposited to form an n-type electrode 16 on the back of the substrate 1 by use of an E-beam method, so that the present optical integrated circuit can be fabricated.

According to the present invention, a method for fabricating the optical integrated circuit can maximize the opto-coupling efficiency and with no additional epitaxy growth, an optical amplifier having a buried hetero structure can be integrated.

In the present invention, although an optical amplifier is preferably embodied, it is not limited hereto but applicable to optical devices such as a buried laser diode and an optical detector, or the like.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method for fabricating a semiconductor optical integrated circuit including an optical device which has a heterojunction structure constituting by an InP clad layer/an InGaAsP active layer/an InP clad layer and a waveguide, comprising:

a step for primarily growing the InP clad layer/the InGaAsP active layer/the InP clad layer over a substrate;

a step for etching the clad layer and the active layer, thereby forming a rib pattern of a <011> plane;

a step for sequentially growing an InGaAs layer and an InP clad layer constituting the waveguide for opto-coupling by use of a metal organic chemical vapor deposition method, wherein on growing the InP clad layer, a (111) plane is formed at the edge portion of the rib pattern and the InGaAs layer is grown not in the (111) plane but in a (011) plane;

a step for etching the InP layer over the rib pattern using a selective etchant for InP under a condition that the InGaAs layer is used as a self-aligned mask;

a step for etching the InGaAsP layer of the optical amplifier and the InGaAs layer using a selective etchant for InGaAs and InGaAsP; and a step for growing a p-type InP clad layer and a cap layer made of a p-type InGaAs over the whole surface of the substrate.

2. A method for fabricating a semiconductor optical integrated circuit including an active-optical device and a wadeguide, comprising:

a primary epitaxy growth process for sequentially growing a buffer layer made of an n-type InP, an active layer made of InGaAsP and a clad layer made of a p-type InP constituting an active-optical device over an InP wafer by use of a primary epitaxy growth;

a first etching process for etching the clad layer and the active layer along a <011> plane perpendicular to a (001) plane, thereby forming a rib pattern;

a secondary process for sequentially growing a core layer made of InGaAsP and InP clad layers of n/p/n structure constituting a waveguide by use of a metal organic chemical vapor deposition method, said layers is not formed at a (111) plane of the rib pattern;

a second etching process for selectively etching the InP clad layers of n/p/n structure over the rib pattern; and a third epitaxy growth process for growing a clad layer made of a p-type InP and a cap layer made of a p-type InGaAs constituting an active-optical device.

3. A method for fabricating a buried semiconductor laser diode, comprising:

a step for sequentially growing a buffer layer made of an n-type InP, an active layer made of InGaAsP and a clad layer made of a p-type InP over the front surface of a substrate;

a step for etching the clad layer to form a rib pattern in a <011> plane;

a step for growing a selective etching stop layer of a p-type InGaAs or a p-type InGaAsP very thinly and an InP current block layer of n/p/n structure by use of a metal organic chemical vapor deposition method, wherein on growing InP layers, a (111) plane is formed;

a step for growing an InGaAs layer except for the (111) plane of the rib pattern;

a step for selectively etching the InP clad layer of n/p/n structure over the rib pattern by use of a selective etchant for InP under a condition that the InGaAs layer is used as a mask;

a step for selectively etching the InGaAs layer and the selective etching stop layer by use of a selective etchant for InGaAs;

a step for growing a p-type clad layer and a p-type InGaAs cap layer over the whole surface of the substrate; and a step for forming a p-type electrode and an n-type electrode over the front and rear surfaces of the substrate.

* * * * *